(12) United States Patent
Zribi et al.

(10) Patent No.: US 7,315,161 B2
(45) Date of Patent: Jan. 1, 2008

(54) MICRO-ELECTROMECHANICAL SYSTEM (MEMS) BASED CURRENT AND MAGNETIC FIELD SENSOR HAVING CAPACITIVE SENSE COMPONENTS

(75) Inventors: Anis Zribi, Rexford, NY (US); Glenn Scott Claydon, Wynantskill, NY (US); Christopher James Kapusta, Duanesburg, NY (US); Laura Jean Meyer, Schenectady, NY (US); Ertugrul Berkcan, Clifton Park, NY (US); Wei-Cheng Tian, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 67 days.

(21) Appl. No.: 11/129,682

(22) Filed: May 13, 2005

(65) Prior Publication Data
US 2005/0270014 A1 Dec. 8, 2005

Related U.S. Application Data

(63) Continuation-in-part of application No. 10/863,442, filed on Jun. 7, 2004, now Pat. No. 7,112,951.

(51) Int. Cl.
*G01R 33/00* (2006.01)
(52) U.S. Cl. .................... 324/126; 324/117 R
(58) Field of Classification Search ............... None
See application file for complete search history.

(56) References Cited

U.S. PATENT DOCUMENTS

| | | | |
|---|---|---|---|
| 5,952,819 A | 9/1999 | Berkcan et al. | |
| 6,215,318 B1* | 4/2001 | Schoefthaler et al. | 324/658 |
| 6,348,788 B1* | 2/2002 | Yao et al. | 324/99 R |
| 6,384,353 B1* | 5/2002 | Huang et al. | 200/181 |
| 6,664,786 B2* | 12/2003 | Kretschmann et al. | 324/259 |
| 6,690,178 B2 | 2/2004 | Harris et al. | |
| 2002/0021122 A1 | 2/2002 | Yao et al. | |
| 2002/0158040 A1 | 10/2002 | Lucak et al. | |
| 2004/0158439 A1* | 8/2004 | Kim et al. | 702/190 |
| 2005/0262943 A1 | 12/2005 | Clayton et al. | |

FOREIGN PATENT DOCUMENTS

| | | |
|---|---|---|
| EP | 1006365 | 6/2000 |
| EP | 1306678 | 5/2003 |
| WO | 3012459 | 2/2003 |

OTHER PUBLICATIONS

Copending U.S. Appl. No. 10/854,845, filed May 27, 2004, entitled "Apparatus, Methods and Systems to Detect an Analyte Based on Changes in a Resonant Frequency of a Spring Element".

* cited by examiner

*Primary Examiner*—Minh N. Tang
(74) *Attorney, Agent, or Firm*—Jason K. Klindtworth; Jean K. Testa

(57) ABSTRACT

A micro-electromechanical system (MEMS) based current & magnetic field sensor includes a MEMS-based magnetic field sensing component having a capacitive magneto-MEMS component, a compensator and an output component for sensing magnetic fields and for providing, in response thereto, an indication of the current present in a respective conductor to be measured. In one embodiment, first and second mechanical sense components are electrically conductive and operate to sense a change in a capacitance between the mechanical sense components in response to a mechanical indicator from a magnetic-to-mechanical converter.

14 Claims, 12 Drawing Sheets

US 7,315,161 B2

MICRO-ELECTROMECHANICAL SYSTEM (MEMS) BASED CURRENT AND MAGNETIC FIELD SENSOR HAVING CAPACITIVE SENSE COMPONENTS

RELATED APPLICATIONS

This application is a continuation-in-part of U.S. patent application Ser. No. 10/863,442, filed Jun.7, 2004 now U.S. Pat. No. 7,112,951 entitled "MEMS BASED CURRENT SENSOR USING MAGNETIC-TO-MECHANICAL CONVERSION AND REFERENCE COMPONENTS", which is hereby fully incorporated by reference.

BACKGROUND

The present disclosure relates generally to electrical current and magnetic field sensing devices. More particularly, the present disclosure relates to a micro-electromechanical system (MEMS) based current and magnetic field sensor.

It is known that a current carrying conductor produces a magnetic field in the vicinity of the current carrying conductor. It is also known that the magnetic field produced by the current carrying conductor can induce a force with another current carrying conductor disposed in the magnetic field produced by that current carrying conductor. As such, one approach used to sense electrical current involves the use of a sensor that measures the magnetic field induced by current flowing in a current carrying conductor. Since the generated magnetic field is proportional to the current flowing in the current carrying conductor, such a sensor can use the magnitude of the magnetic field to determine the current.

Current sensors that use magnetic fields to measure electrical current are well suited for high voltage applications from a safety perspective because they do not have to contact the high voltage circuitry. However, there are several disadvantages associated with existing current sensors that use magnetic fields to measure electrical current in high voltage applications. In general, existing current sensors tend to have a large form factor because they require a thick conductor that can withstand the varying levels of current flow that may be experienced. This current flow induces heating, which reduces the efficiency of the current sensors and introduces a possible error factor in sensor accuracy. Since existing current sensors are large and bulky, their physical and electrical operating characteristics have up to now prevented their use in smaller scale environments.

BRIEF DESCRIPTION

In one embodiment, there is provided a micro-electromechanical system (MEMS) current & magnetic field sensor for sensing a magnetic field produced by a conductor including a MEMS-based magnetic field sensing component having a capacitive magneto-MEMS component for sensing the magnetic field and, in response thereto, providing an indication of the current in the conductor.

In one embodiment, there is provided a MEMS current & magnetic field sensor for sensing a magnetic field produced by a current carrying conductor. The MEMS current & magnetic field sensor includes a first structural component, a second structural component coupled to the first structural component, and a magnetic-to-mechanical converter coupled to at least one of the first and second structural components for providing a mechanical indication of the magnetic field. The MEMS current & magnetic field sensor further includes a mechanical sense component for sensing the mechanical indication based at least in part upon a change in capacitance, and in response thereto, providing an indication of the current in the current carrying conductor.

In yet another embodiment, there is provided a method of fabricating a MEMS current & magnetic field sensor including providing a first substrate having a front side, a back side, and a first electrode. Forming a cavity through the back side of the first substrate to produce a membrane on the front side. Providing a second substrate having a second electrode and aligning the first and second substrates such that as the membrane is deflected into the cavity, a capacitance defined between the first and second electrodes changes.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
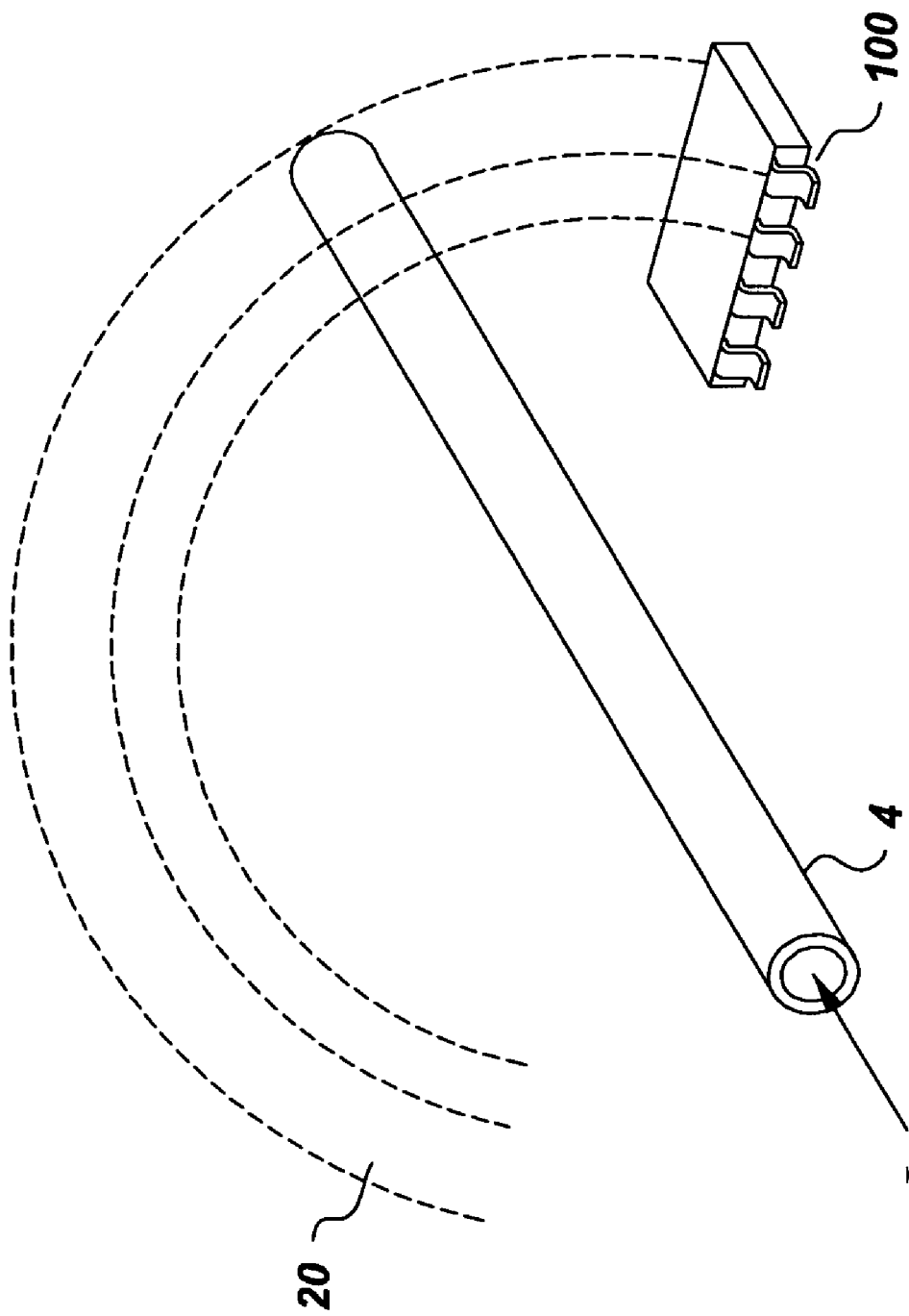
FIG. 1 is a schematic diagram representative of a MEMS-based current and magnetic field sensor constructed in accordance with various embodiments of the invention.

FIG. 1 illustrates one embodiment of a MEMS current and magnetic field sensing device described herein and hereinafter generally referred to as "current sensor 100". As shown, conductor 4 carrying a current I generates a magnetic field 20. In accordance with one embodiment of the present disclosure, current sensor 100 can be used to sense the current I in a current carrying conductor 4, without having to make physical contact with the current carrying conductor. In accordance with the illustrated embodiment, the MEMS-based current sensor 100 operates to sense and determine the current I carried by the conductor 4 by making use of the Lorentz force resulting when current sensor 100 is positioned in the magnetic field 20 generated by current I. In one embodiment, the current sensor 100 includes a magnetic field sensing component having a capacitive magneto-MEMS component for sensing magnetic fields and for providing, in response thereto, an indication of the current present in the respective conductors to be measured.

The advantageous size of a MEMS-based current and magnetic field sensor, such as current sensor 100 described herein, facilitates the sensing of current in applications where space is limited. Moreover, the use of MEMS-based components provides a current sensor that is highly accurate, reliable, robust, and introduces little to no error to the current being sensed. Due, at least in part, to the non-contact sensing methods described herein for sensing current using MEMS current sensor 100, the MEMS current sensor 100 preferably has no impact on the magnitude and/or direction of the current being sensed. For example, given the dimensions of MEMS-based components and the sensitivity of the same, the MEMS current sensor 100 preferably does not introduce or cause any appreciable variation or change in the current being sensed or measured. Moreover, the MEMS current sensor 100 is advantageous for its reduced cost and significantly reduced size over existing current sensors. Further, due to micro-lithography and micro-fabrication techniques, the fabrication of the MEMS current sensor 100 is advantaged through increased accuracy and precision.

Figure 2:
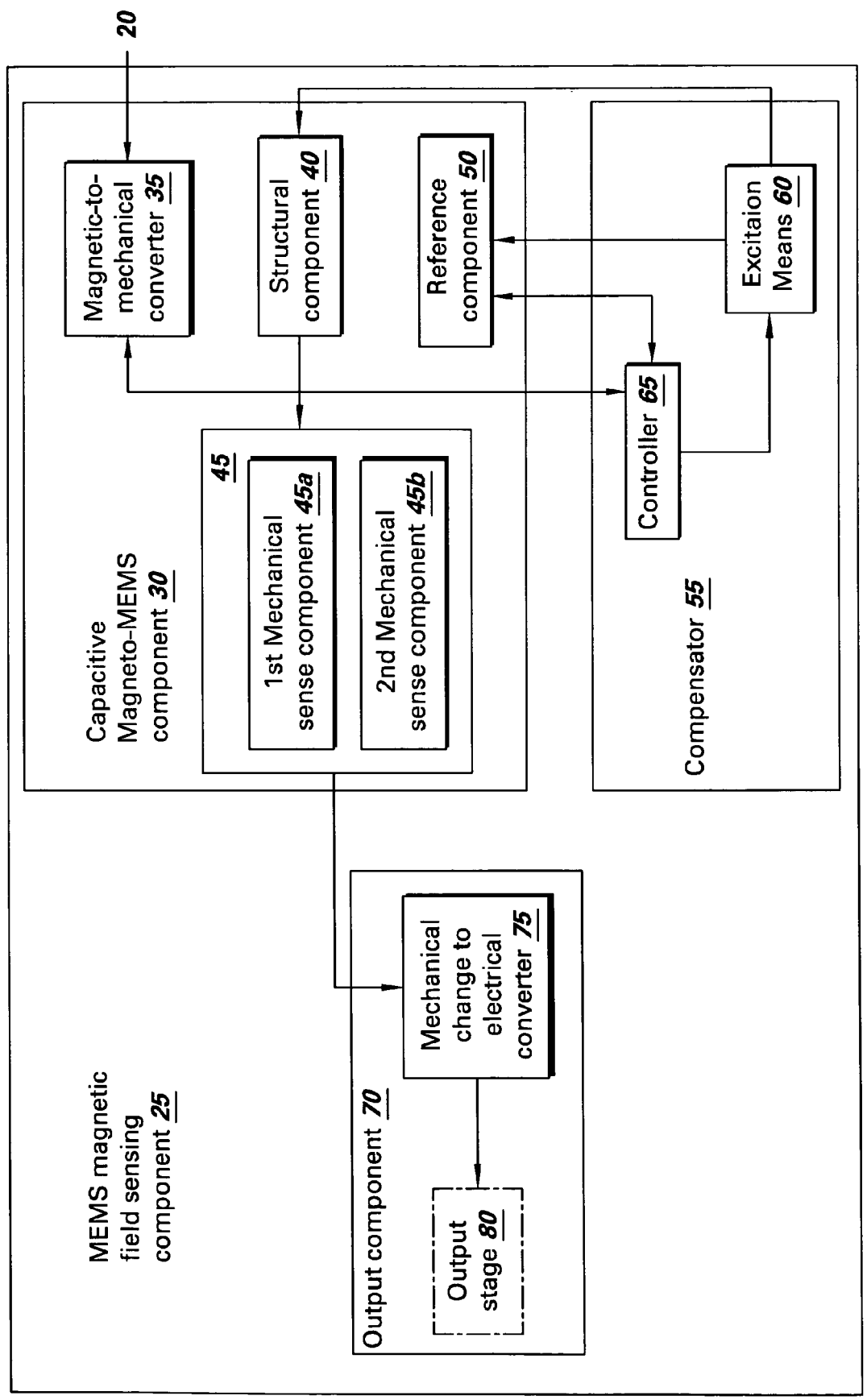
FIG. 2 is a schematic diagram illustrating one embodiment of MEMS-based current sensor 100.

FIG. 2 is a schematic diagram illustrating one embodiment of a MEMS-based magnetic field sensing component 25 of MEMS-based current sensor 100. The MEMS-based magnetic field sensing component 25 senses magnetic fields such as magnetic field 20 and provides an indication of the current in a corresponding current carrying conductor, such as conductor 4. The sensed indication of the current may include both a magnitude and a directional component regarding the current being sensed. In one embodiment, the sensed indication of the current is an electrical indication of the current being sensed.

In the illustrated embodiment of FIG. 2, the MEMS-based magnetic field sensing component 25 includes a capacitive magneto-MEMS component 30, a compensator 55 and an output component 70. The capacitive magneto-MEMS component 30 senses a magnetic field and, in response thereto, converts the sensed magnetic field to a mechanical indicator of a corresponding current I. The output component 70 provides an output indicative of the current I in the conductor being measured. In one embodiment, output from the output component 70 may take the form of an electrical signal indicative and representative of the magnitude and sign of the current flowing in the conductor being measured.

In the illustrated embodiment, the capacitive magneto-MEMS component 30 includes a magnetic-to-mechanical converter 35 for converting the magnetic representation of the current I to a mechanical change. In one embodiment, the magnetic-to-mechanical converter 35 may be a conductor such as a coil. Additionally, the illustrated capacitive magneto-MEMS component 30 includes a structural component 40 for providing structural support to capacitive magneto-MEMS component 30. The structural component 40 may represent one or more heterogeneous or homogeneous structures, devices, materials, assemblies, sub-systems, and so forth. For example, in one embodiment, the structural component 40 may represent a first structural component in the form of a first substrate and a second structural component in the form of a second substrate. In one embodiment, the structural component 40 is responsive to the mechanical change provided by the magnetic-to-mechanical converter 35 and provides a mechanical indicator representative of the current I. The mechanical indicator may be representative of movement experienced by the structural component 40 that registers or otherwise indicates the sensing of the magnetic field. In one embodiment, the mechanical indicator may be an induced force or stress on the structural component 40. In yet another embodiment, the mechanical indicator may include modification of a mechanical property of the structural component 40, such as, for example, a spring constant and the mass thereof. In one embodiment, the structural component 40 may include one or more of a deflectable membrane, a cantilever, a diaphragm, a flexure member, a cavity, a surface micro-machined structure, a bulk micro-machined structure, a comb structure, a bridge or any number of other structural devices. Moreover, the mechanical indicator provided by the structural component 40 may convey the vector space value of the mechanical indicator, including one or more of an associated amplitude, direction, speed, and any other characteristic thereof that can be used to convey the vector space value of the mechanical indicator.

In one embodiment, the capacitive magneto-MEMS component 30 includes at least one mechanical sense component 45 for sensing the mechanical indicator provided by structural component 40. In the illustrated embodiment, the capacitive magneto-MEMS component 30 includes a first mechanical sense component 45a and a second mechanical sense component 45b. The first and second mechanical sense components (45a, 45b) may be electrically conductive and may be supported by respective first and second structural components such that a capacitance is produced between the two mechanical sense components. In one embodiment, the first and second mechanical sense components operate to sense a change in the capacitance between the sense components in response to the mechanical indicator from magnetic-to-mechanical converter 35. In one embodiment, the mechanical indicator is sensed as a measurable force, such as a Lorentz force, exerted on at least one of the first and second mechanical sense components (45a, 45b) via the magnetic to mechanical converter 35. In one embodiment, the magnetic to mechanical converter 35 is coupled to at least one of the first and second mechanical sense components.

The sensed mechanical indicator may be converted to an interface signal representative of the sensed current I. In one embodiment, the mechanical-to-electrical converter 75 converts the sensed mechanical indicator for interpretation and/or further processing by the output stage 80. The mechanical-to-electrical converter 75 may be designed based on the nature of the mechanical sense components 45a and 45b. In one embodiment, the mechanical-to-electrical converter 75 is based on a capacitive element, however in other embodiments the mechanical-to-electrical converter 75 may be based on, for example, a metal strain element, a piezoresistive element, a piezoelectric element, a tunneling element, or an optical element. In particular, the mechanical-to-electrical converter 75 may include a capacitive bridge and a resistive Wheatstone bridge. Output stage 80 may interface with a memory, an indicator (e.g., a display screen), and/or another device or apparatus (e.g., a digital signal processor or computer-based analyzer) for further processing.

Additionally, compensator 55 may be used to compensate for effects due to e.g., aging of the sensor, temperature, environmental factors, etc. The compensator 55 may include an excitation source (such as a current source) 60 and a controller 65. The excitation source 60 may provide excitation quanta (i.e., an amount of excitation energy) for use by the MEMS current sensor 100. The controller 65 may control, for example, a switching and an application of the excitation quanta of the excitation source 60 and the reference signal of the reference component 50. The controller 65 may be, for example, a switch, an analog processor, a digital signal processor, a digital computing device or an analog-computing device. In the present example, the controller controls at least an on, off, and a value of a bias current supplied to the magnetic-to-mechanical converter 35. In another embodiment, the controller may select between differing values of the excitation quanta and a plurality of reference components 50. Such reference components may be included for enhancing a function of the MEMS current sensor. For example, a switch may be included for activating, processing, and controlling logic functions associated with the MEMS current sensor.

Although the output component 70, the capacitive magneto-MEMS component 30 and the compensator 55 of FIG. 2 appear as separate components, these components and their respective functional blocks can be further combined or further partitioned without departing from the spirit and scope of the disclosure.

Figure 3A:
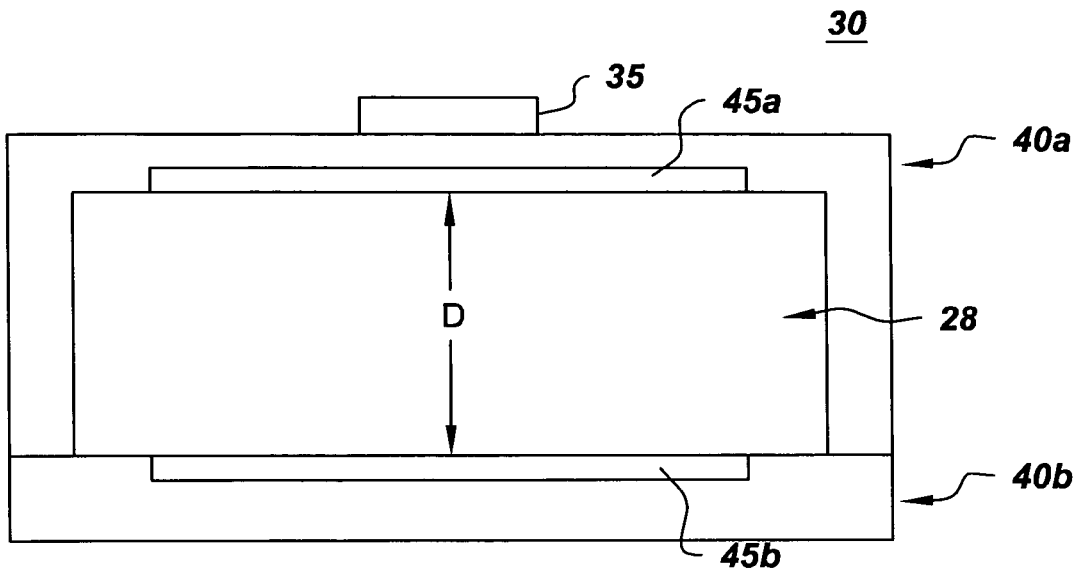
FIG. 3 illustrates one embodiment of a capacitive magneto-MEMS component.
Figure 3B:
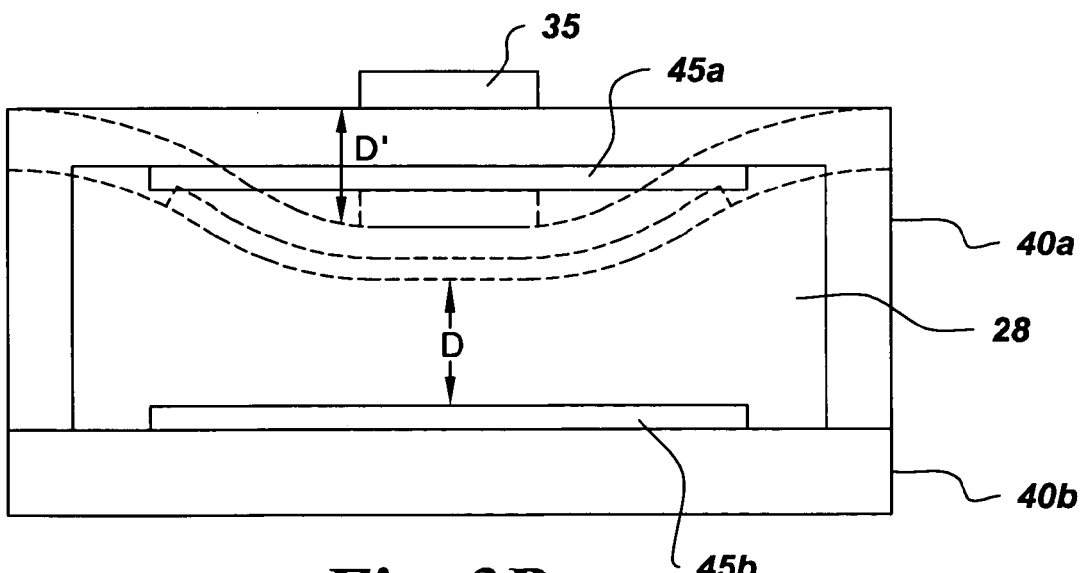

FIG. 3 illustrates one embodiment of a capacitive magneto-MEMS component. In FIG. 3, capacitive magneto-MEMS component 30 includes structural component 40 shown as a first structural component 40a and a second structural component 40b positioned substantially opposite the first structural component 40a. In one embodiment, the first structural component 40a includes a first mechanical sense component 45a and the second structural component 40b includes a second mechanical sense component 45b. The first and second mechanical sense components 45a and 45b may each represent an electrically conductive region or material (herein referred to as an "electrode") contained by or coupled to the first or second structural components 40a or 40b, respectively. In one embodiment, the first and second structural components 40a and 40b respectively represent first and second substrates. For example, the first and second mechanical sense components may each represent a layer, region or trace of conductive material, such as a metal, disposed on or formed within a substrate such as Silicon. In one embodiment, the first structural component 40a represents a substrate having a cavity 28 defined therein such that a membrane is formed at least partly above the cavity. In one embodiment, the membrane is formed from released silicon nitride disposed on the substrate.

In accordance with one embodiment, during operation of the capacitive magneto-MEMS component 30, a voltage differential is applied across the first and second structural components (40a and 40b) causing a capacitance to develop between the first and second mechanical sense components 45a and 45b (thereby causing the sense components to effectively act as plates of a capacitor). Since the capacitance between the first and second sense components 45a and 45b (e.g. plates) is a function of the distance D separating the sense components, a change in distance D will affect a corresponding change in the capacitance. In the illustrated embodiment, a magnetic-to-mechanical converter 35 is coupled to the first structural component 40a such that when the capacitive magneto-MEMS component 30 is placed in the vicinity of an external current carrying conductor, and a small bias current is flowed in the magnetic-to-mechanical converter 35, the magnetic field generated by the external conductor will exert a force (e.g., Lorentz force) on the magnetic-to-mechanical converter 35. The bias current used may be in the range of uA or mA however a typical bias current might be 1-10 mA. Moreover, a DC or AC bias current may be used without modification to the capacitive magneto-MEMS component 30. Moreover, by driving an AC bias current at frequency that coincides with the resonant frequency of the device, it is possible to further increase sensitivity of the device. As shown in the bottom half of FIG. 3, the Lorentz force will cause the first structural component 40a (e.g. first substrate) to deflect a distance D' thereby decreasing the distance D, and in turn increasing the capacitance, between the first and second sense components 45a and 45b. In an alternative embodiment, the magnetic-to-mechanical converter 35 may itself act as a sense component depending upon the structure of the capacitive magneto-MEMS component 30.

While discussed primarily in the context of using the Lorentz force between the first and second sense components, the magnetic-to-mechanical converter 35 can be modified to use mutual inductance, a moving loop and a magnetic field generated by an external current carrying conductor. Additionally, other characteristic relationships may be used to derive a mechanical indicator of the mechanical indicator corresponding to the current being sensed.

Due to batch manufacturing techniques of micro-machining and the associated cost efficiencies, the MEMS-based current sensor 100 as described herein can be manufactured in large batches using for example, photolithography and etching. As noted above, the MEMS device of FIG. 2 is but one example of a current sensor contemplated in accordance with the present disclosure. Other embodiments of the MEMS-based current sensor 100 may include the use of multiple MEMS devices in the current sensor for the purpose of, for example, magnetic field shaping, magnetic field sensing, current value indicating, and other purposes.

Using micro-machining and micro-lithography manufacturing processes, the first and second structural components (40a, 40b), the first and second mechanical sense components (45a, 45b) and magnetic-to-mechanical converter 35 may be constructed in separate layers of conductive metal and insulating material to provide a single MEMS-based current sensor that uses the force between current carrying conductors to sense an unknown current flowing in an external one of the conductors. In various embodiments the magnetic-to-mechanical converter 35 may be a conductor formed from a single metal or two or more metals. In the event the magnetic-to-mechanical converter 35 is formed from two or more metals, each such metal may be separated wholly or partly by an insulating layer or a dielectric layer. For example, FIGS. 4-15 illustrate aspects of a capacitive magneto-MEMS component employing a magnetic-to-mechanical converter formed from two metal layers according to one embodiment. In comparison, FIGS. 16-22 illustrate aspects of a capacitive magneto-MEMS component employing a magnetic-to-mechanical converter formed from a single metal layer structure according to another embodiment. Depending upon various design considerations, it may be preferable to use a capacitive magneto-MEMS component having a single metal conductor over one with multiple metal conductors, or vice-versa. For example, the overall fabrication of the capacitive magneto-MEMS component and resultant MEMS current sensor can be simplified through the use of a single metal conductor. On the other hand, multiple metal conductors may be useful to facilitate signal routing from the structural component 40 (e.g., membrane) in situations where the magnetic-to-mechanical converter or coil is located on the structural component. Additionally, multiple metal layers may be useful in balancing the effects of differing temperature coefficients of expansion, which may otherwise initiate an unnecessary stress upon the system.

Figure 4:
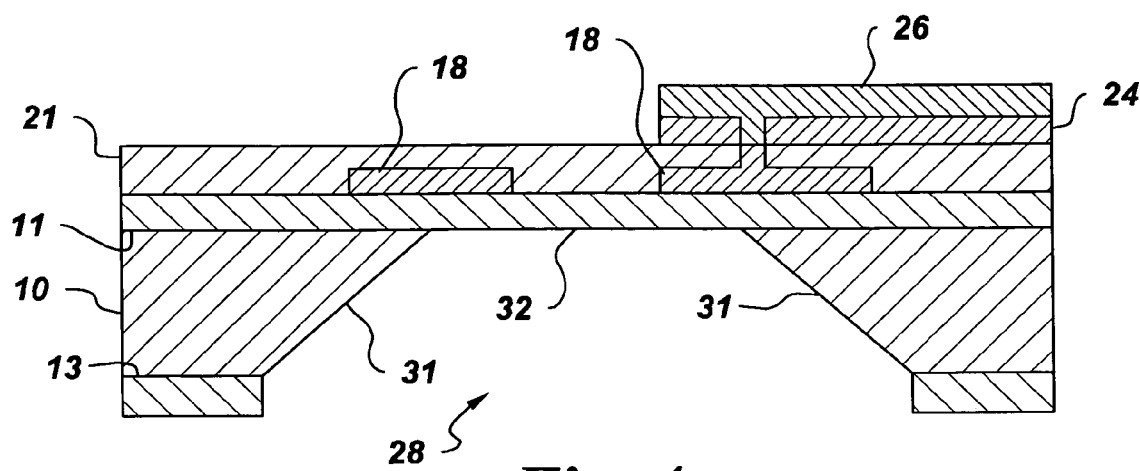
FIG. 4 illustrates a schematic sectional side elevational view of aspects of capacitive magneto-MEMS component 30 according to one embodiment.

FIG. 4 shows a schematic sectional side elevational view of aspects of capacitive magneto-MEMS component 30 according to one embodiment. In the illustrated embodiment, capacitive magneto-MEMS component 30 includes a substrate 10 having an upper surface 11 and a lower surface 13. Formed through a portion of the lower surface 13 of the substrate 10 is a cavity 28 having walls 31 extending to the upper surface 11. Disposed on the upper surface of the substrate 10 and at least partially above the cavity 28 is a membrane 32. A conductor 18 for carrying current is further disposed at least partially over the membrane 32. In FIG. 4 the conductor 18 is shown in the form of contact pads. The conductor 18 may comprise a variety of electrically conductive materials including but not limited to Ti, W, AU, Al, Pt, Pd, Cu, Cr, doped polysilicon, doped silicon, SiC, GaN and so forth. In one embodiment, the membrane 32 comprises silicon nitride, however, the membrane may instead comprise polymers, polysilicon, Si, oxide, oxinitride, silicon dioxide and so forth. A dielectric material 21 is disposed over the membrane 32 and the conductor 18. The dielectric material 21 may comprise e.g., a polyimide or silicon dioxide. In one embodiment, the dielectric material has a thickness that ranges from about 1000 Å to about 1 um. In one embodiment, a second conductor is disposed on the dielectric material 21. In FIG. 4, the second conductor is represented by layers 24 and 29. Layer 24 may be a conductive layer such as a metal comprising Ti/W/Au, however, other electrically conductive materials such as Al, Pt, Pd, Cu, Cr, doped polysilicon, doped silicon, SiC, GaN may be used. In one embodiment, layer 24 has a thickness that ranges from about 1000 Å to about 1 um. Layer 29 is disposed on layer 24 and provides a connection to one of the contact pads that comprises the first conductor 18. In one embodiment, layer 29 may be Au, however, other electrically conductive materials such as Al, Pt, Pd, Cu, Cr, doped polysilicon, doped silicon, SiC, GaN may be used.

Figure 5:
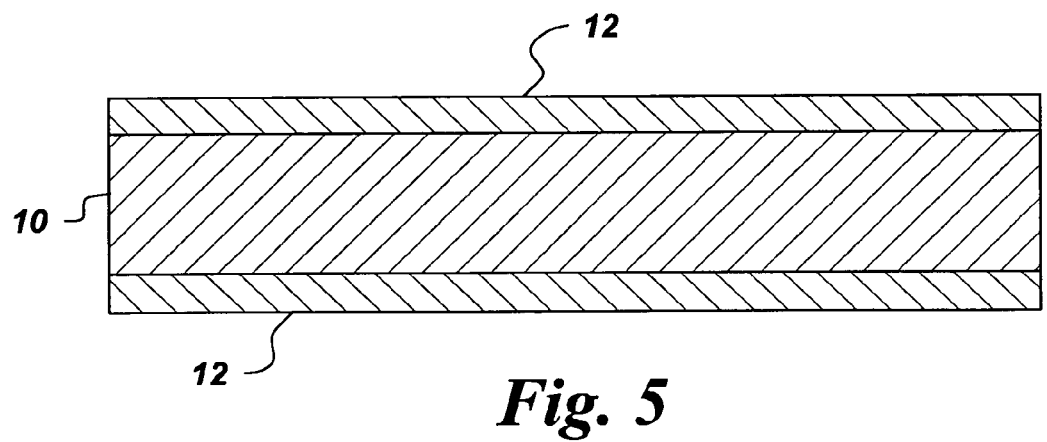
FIGS. 5-15 illustrate one embodiment of a fabrication method for a capacitive magneto-MEMS component employing a magnetic-to-mechanical converter formed from two metal layers.

FIGS. 5-15 illustrate one embodiment of a fabrication method for a capacitive magneto-MEMS component employing a magnetic-to-mechanical converter formed from two metal layers e.g., as shown in FIG. 4. The specific processing conditions and dimensions serve to illustrate one specific fabrication method but can be varied depending upon the materials used and the desired application and geometry of the MEMS current and magnetic field sensor. As shown in FIG. 5, the fabrication method begins with provision of a substrate 10. In the illustrated embodiment, the substrate 10 is a silicon substrate, however other materials having similar properties may be used. Next, silicon nitride coatings 12 are applied to the front side and backside of the substrate 10. The thickness of the silicon nitride coatings 12 may typically range from about 1 nm to about 10 um, however, other thickness ranges can be used. In one embodiment, the silicon nitride is of the low stress amorphous type (e.g., 50-300 Mpa), but use of materials such as crystalline silicon nitride, silicon, silicon dioxide, polymers . . . etc., in place of silicon nitride is also possible. In one embodiment, the silicon nitride coatings 12 are deposited on the substrate 10 using a low pressure chemical vapor deposition technique.

Figure 6:
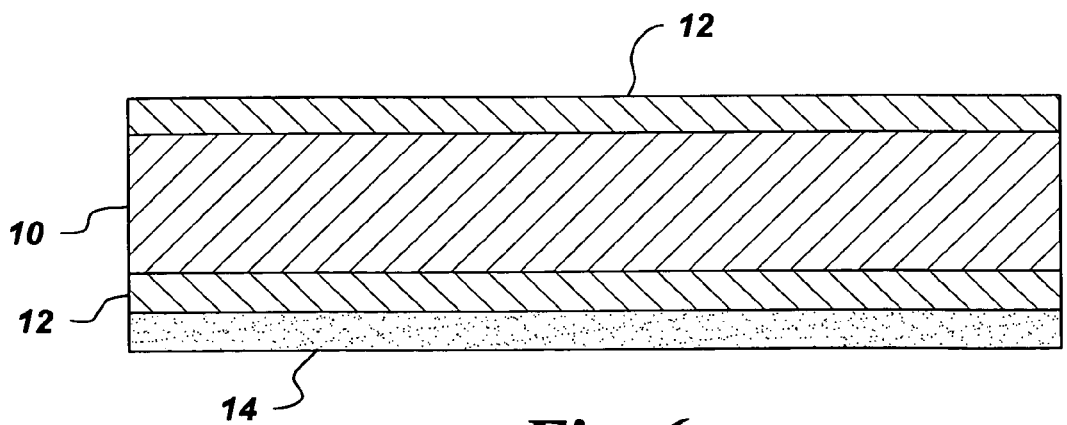
Figure 7:
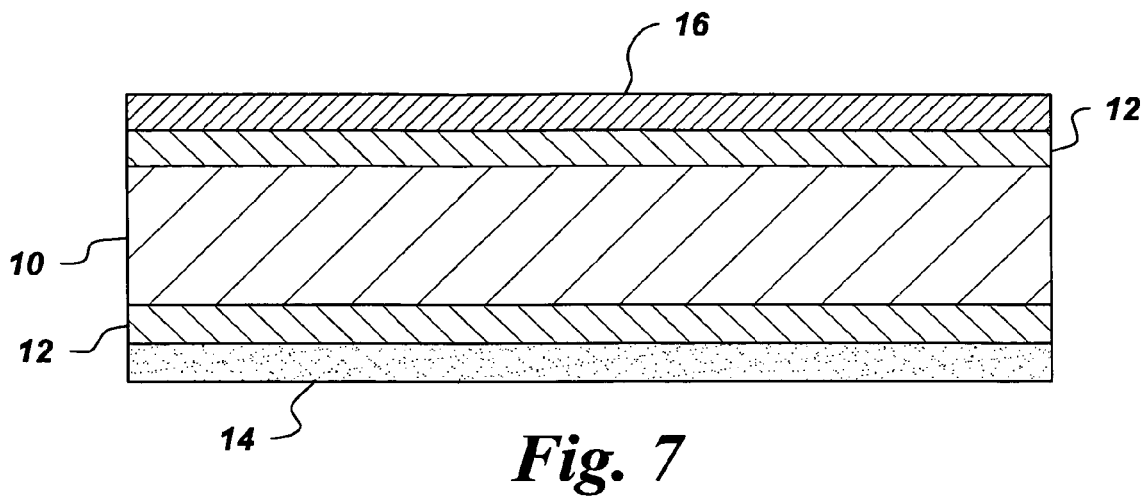

FIG. 6 shows a photoresist material 14 coated on one of the silicon nitride coatings 12 at the backside of the substrate 10. The photoresist material 14 is exposed to a pattern using a photolithographic technique at a later time. As shown in FIG. 7, a conductive layer 16 is deposited on the silicon nitride coating 12 on the front side of the substrate 10. In one embodiment, the conductive layer 16 may include Ti/W/Au. However, other electrically conductive materials may be used for the conductive layer 16 such as e.g., Al, Pt, Pd, Cu, Cr, doped polysilicon, doped silicon, silicon dioxide, SiC, GaN and so forth. In one embodiment, the metallic coating 16 is deposited on the front side silicon nitride coating 12 using a sputtering technique and may have a thickness that ranges from about 1 nm to about 10 um.

Figure 8:
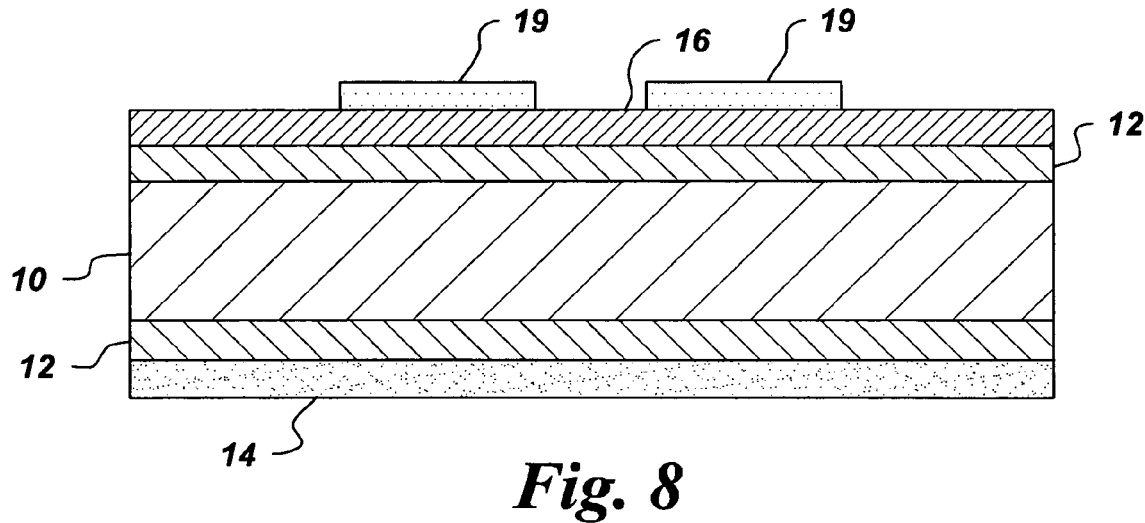
Figure 9:
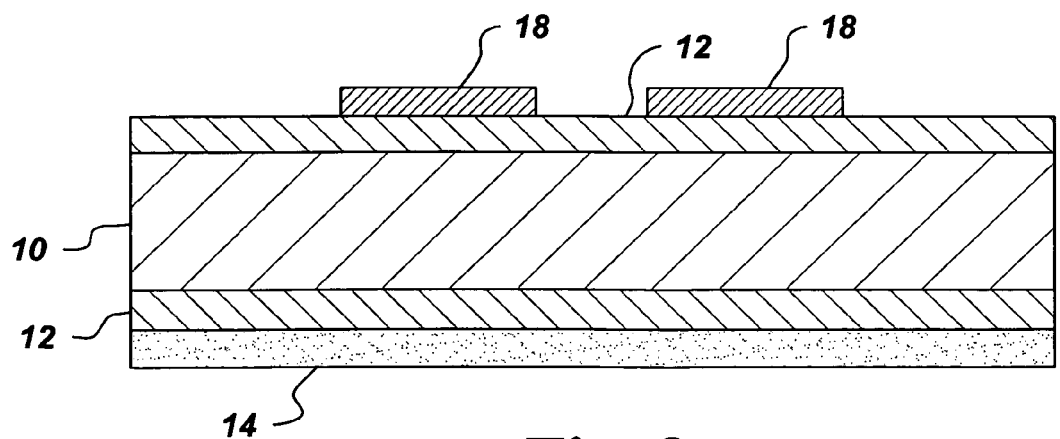

FIG. 8 shows photoresist material 19 deposited on the metallic coating 16. As shown in FIG. 8, the photoresist material 19 takes the form of two contact pads or islands. In this embodiment, the photoresist material 19 has a thickness that ranges from about 10 nm to about 10 um. As shown in FIG. 9, the photoresist material 19 is patterned, exposed and developed using a photolithography technique. In addition, FIG. 9 shows that the conductive layer 16 has been etched away so that the newly formed contact pads 18 reside on the front side silicon nitride coating 12. Generally, a chemical etching or dry etching is suitable for etching the conductive layer 16.

Figure 10:
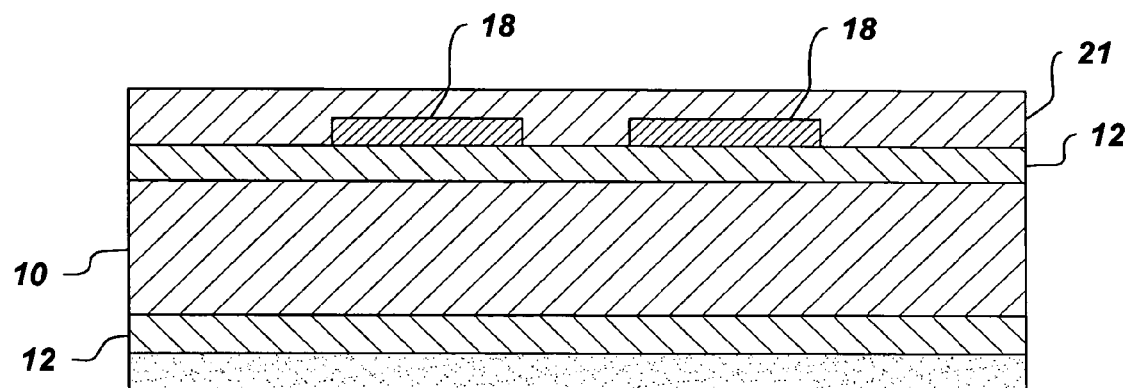

In FIG. 10, a dielectric material 21 is deposited on the contact pads 18 and the silicon nitride coating 12 on the front side of the substrate 10. The dielectric material 21 may be silicon oxide or a polyimide coating such as ULTEM 10B, however, other dielectric materials may be used. The dielectric material can be deposited using chemical vapor deposition or by other deposition techniques such as spin or spray. As explained below, another metallic layer will be deposited on the dielectric material 21, and if the dielectric is too thin, then the metallic layer and the dielectric material may short. Thus, the dielectric material should have a thickness sufficient to prevent such shorts. In one embodiment, the dielectric thickness ranges from about 100 nm to about 10 um. A thickness in this range results in a material having a relatively small porosity that inhibits induced diffusion of metal through the silicon oxide material.

Figure 11:
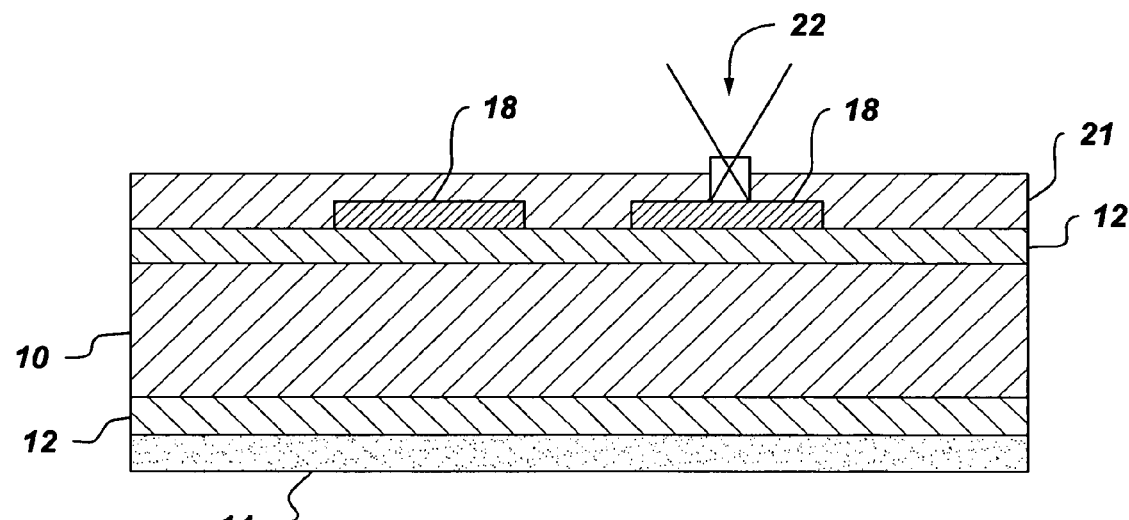

The deposition of the dielectric material 21 prevents access to the contact pads 18 which will be used to make electrical contact and to maintain current. In order to make contact, an opening is made in the dielectric material 21 and a via 22 is created to provide access to the contact pads 18 as shown in FIG. 11. If the dielectric material 21 is a polyimide coating such as ULTEM 10B then the via 22 may be created by using a laser to ablate the material until access is made to the contact pads 18. Alternatively, if the dielectric material is not a polymer, then etching (wet or dry) may be used. For example, if the dielectric material 21 is silicon oxide, then it is possible to use photolithography and etching to make contact with the contact pad 18.

Figure 12:
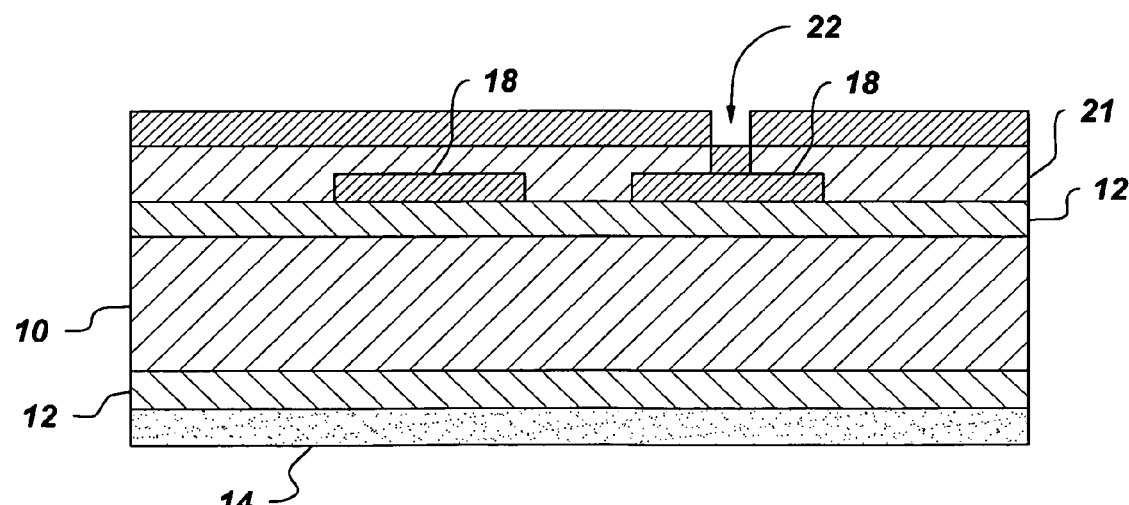

After accessing the contact pad 18, another metal layer is deposited on the dielectric material 21 and in the via 22. FIG. 12 shows a conductive layer 24 deposited on the dielectric material 21 and in the via 22. This conductive layer is patterned to create leads that will provide a bias current to the contact pads 18. In one embodiment, the conductive layer 24 may include Ti/W/Au, however, other electrically conductive materials such as Al, Pt, Pd, Cu, Cr, doped polysilicon, doped silicon, SiC, GaN may be used. In one embodiment, the conductive layer 24 may be deposited on the silicon nitride coating 12 on the front side of substrate 10 using a sputtering or evaporation technique and may have a thickness that ranges from about 1 nm to about 10 um.

Figure 13:
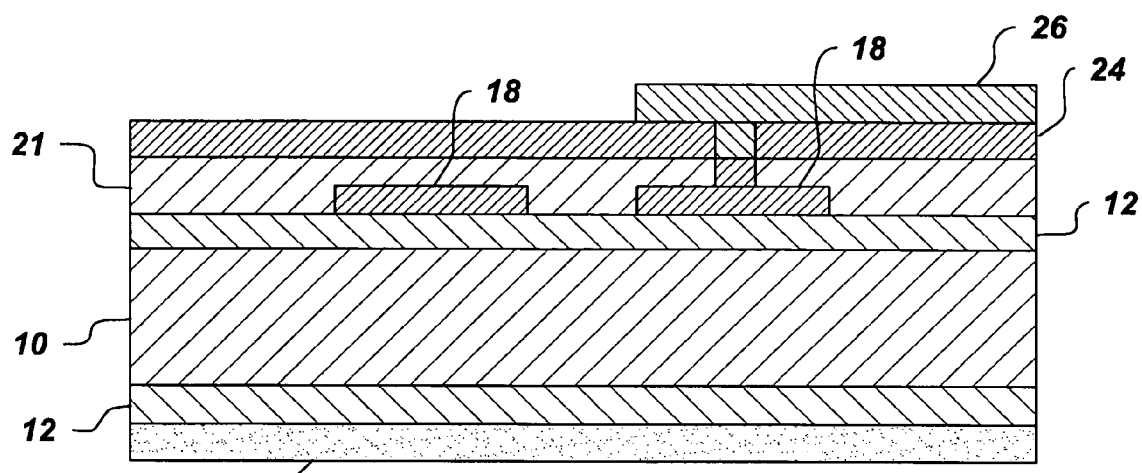
Figure 14:
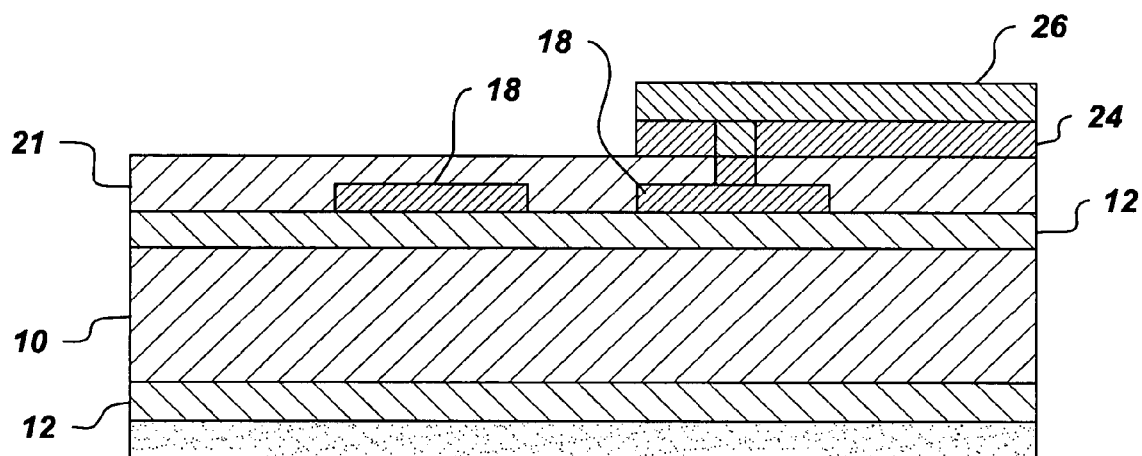

The metalization of conductive layer 24 is further refined by additional photolithography techniques. In particular, FIG. 13 shows a photoresist material 26 deposited on the conductive layer 24. The photoresist material 26 generally has a thickness that ranges from about 10 nm to about 10 um. The photoresist material 26 may be patterned, exposed and developed using optical lithography, however, the use of other photolithographic techniques are possible. After lithography and development of the photoresist material 26, a portion of the conductive layer 24 not covered by the photoresist is etched away using e.g., using a wet etch to define a second conductor or coil of the capacitive magneto-MEMS component 30. FIG. 14 shows that portion of the conductive layer 24 etched away.

Figure 15:
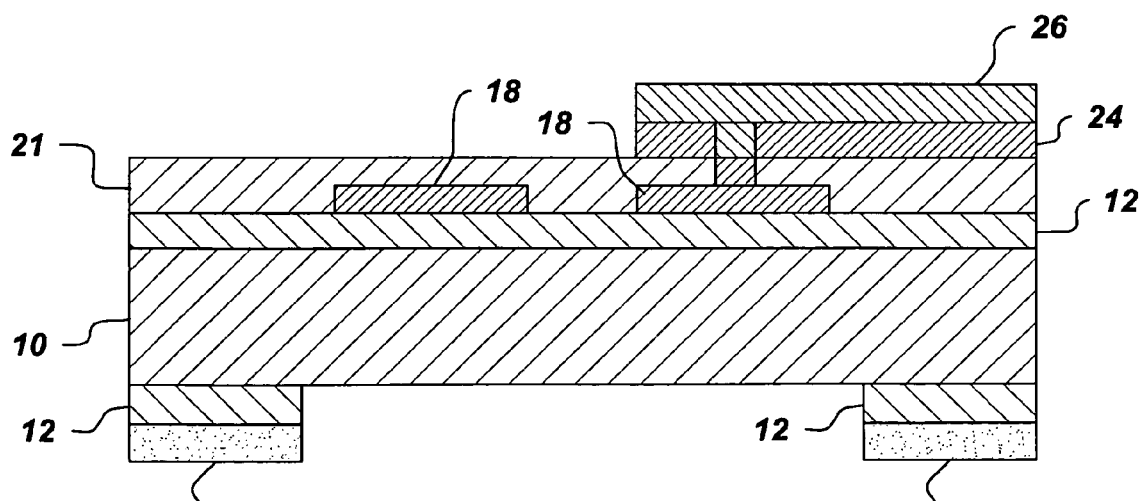

In one embodiment, the membrane 32 is formed after the processing steps of FIGS. 5-14 have been completed. As was alluded to above, formation of the membrane 32 involves the creation of the cavity 28 in the backside of the substrate 10. FIG. 15 shows the beginning of the formation of the cavity through the backside of the silicon nitride coating 12 and the photoresist material 14. In one embodiment, the cavity 28 is formed by etching through the backside of the silicon nitride coating 12 and the photoresist material 14. A dry etching process such as deep reactive ion etching or a wet etching process such as a KOH etching may be used. In one embodiment, an anisotropic etching process may be used such that the walls 31 of the substrate 10 are formed at fixed and/or reproducible angles measured with respect to a plane containing the substrate. For example, because anisotropic etch solutions such as KOH etch preferentially in one crystallographic plane over another, the walls 31 may be formed at an angle determined by the etch rate in the respective crystallographic planes.

As alluded to above, in certain circumstances it might be preferable to simplify the fabrication process of capacitive magneto-MEMS component 30 such that a single metal layer is utilized. By doing so, it is ostensibly possible to reduce the number of processing steps, reduce the membrane thickness, improve the dynamics characteristics of the resulting current sensor while at the same time reducing manufacturing costs.

Figure 16:
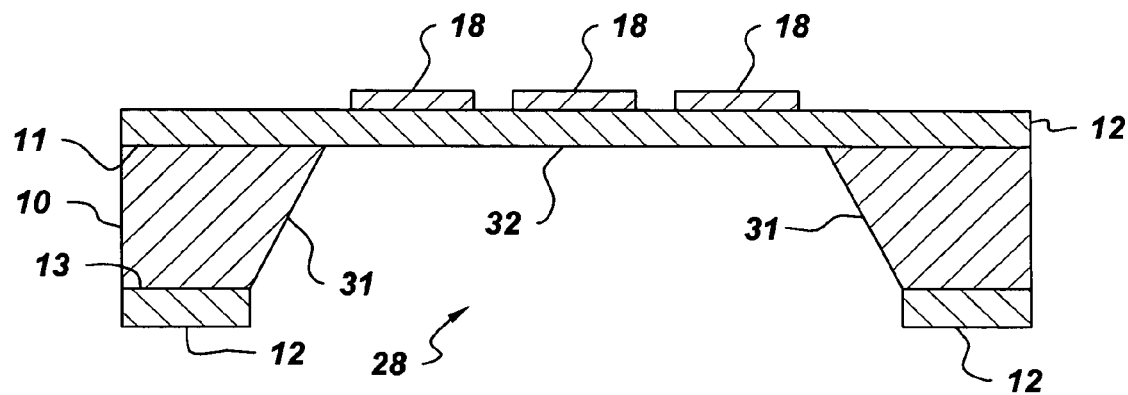
FIGS. 16-23 illustrate aspects of a capacitive magneto-MEMS component employing a magnetic-to-mechanical converter formed from a single metal layer structure according to another embodiment.
Figure 17:
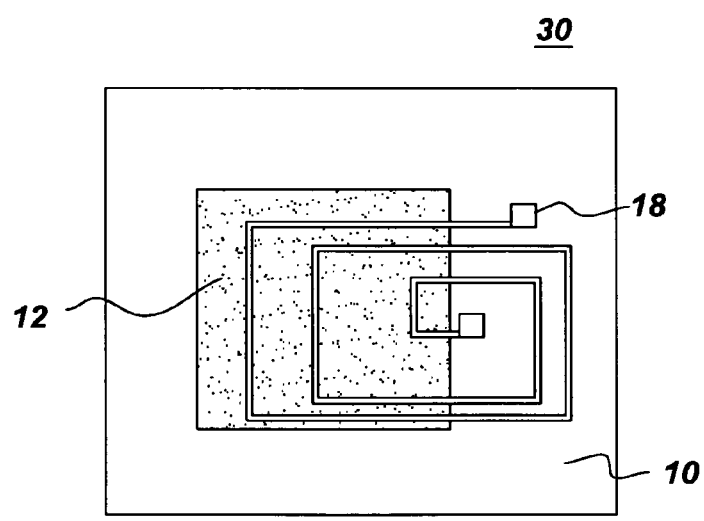

FIGS. 16 and 17 each illustrate a schematic view of aspects of a capacitive magneto-MEMS component according to an alternative embodiment. In FIG. 16, a cross-sectional view illustrated, whereas in FIG. 17 a top view is shown. In the illustrated embodiment of FIGS. 16 and 17, the capacitive magneto-MEMS component 30 includes a substrate 10 having an upper surface 11 and a lower surface 13. Formed through a portion of the lower surface 13 of the substrate 10 is a cavity 28 having walls 31 extending to a portion of the upper surface 11. Disposed on the upper surface of the substrate 10 above the cavity 28 is a membrane 32. As with the illustrated aspects of capacitive magneto-MEMS component 30 of FIG. 4, the illustrated aspects of capacitive magneto-MEMS component 30 of FIGS. 16 and 17 include a magnetic-to-mechanical converter 35 in the form of a conductor. However, in contrast to FIG. 4, the magneto-MEMS component 30 of FIGS. 16 and 17 includes a conductor 18 formed from a single metal layer.

Figure 18:
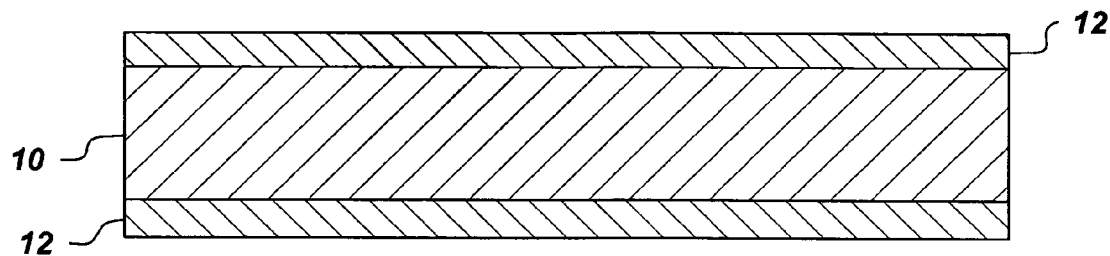

FIGS. 18-23 illustrate one embodiment of a fabrication process for fabricating at least a portion of a capacitive magneto-MEMS component as shown e.g., in FIGS. 16 and 17. The specific processing conditions and dimensions serve to illustrate one specific fabrication method but can be varied depending upon the materials used and the desired application and geometry of the MEMS current and magnetic field sensor. As shown in FIG. 18, the fabrication method begins with provision of a substrate 10. In the illustrated embodiment, the substrate 10 is a silicon substrate, however other materials having similar properties may be used. Next, silicon nitride coatings 12 are applied to the front side and backside of the substrate 10. The thickness of the silicon nitride coatings 12 may typically range from about 1 nm to about 10 um, however, other thickness ranges can be used. In one embodiment, the silicon nitride is of the low stress amorphous type, but use of a crystalline silicon nitride is also possible. In one embodiment, the silicon nitride coatings 12 are deposited on the substrate 10 using a low pressure chemical vapor deposition technique.

Figure 19:
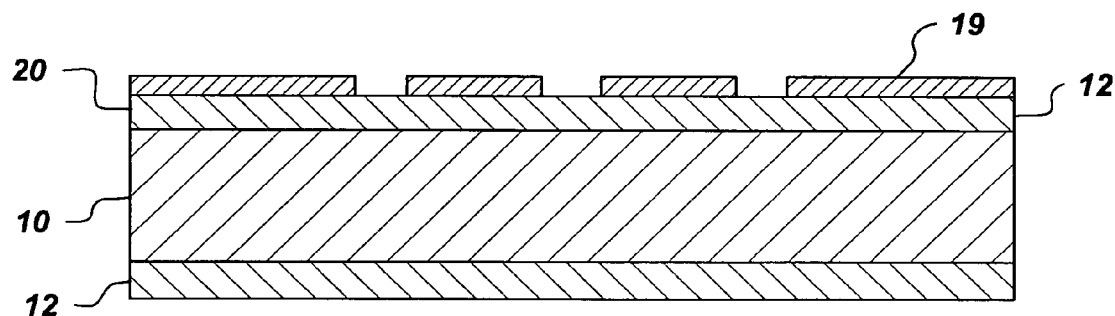

FIG. 19 shows a photolithography process for defining one or more metallic conductors upon the silicon nitride coating 12 (e.g., to act as a magnetic-to-mechanical converter or coil). The photoresist material 19 is patterned, exposed and developed. As shown, photoresist material 19 is patterned on the silicon nitride coating 12 such that the open areas define the future placement of the conductors. In this embodiment, the photoresist material 19 may have a thickness that ranges from about 10 nm to about 10 um.

Figure 20:
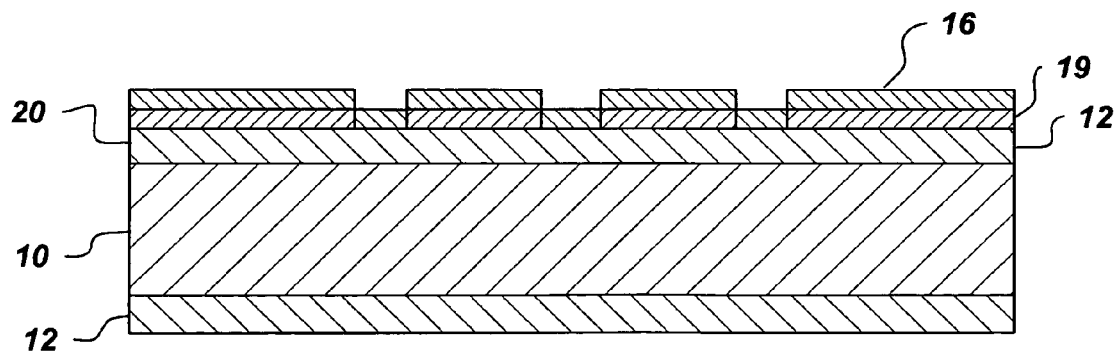

FIG. 20 illustrates deposition of a conductive layer 16 on top of the photoresist material 19 and uncovered areas of the silicon nitride coating 12. In one embodiment, conductive layer 16 may be deposited through physical or chemical vapor deposition techniques such as Molecular Beam Epitaxy or Metal-Organic Chemical Vapor Deposition. In one embodiment, conductive layer 16 may be formed a variety of electrically conductive materials including but not limited to Ti, W, AU, Al, Pt, Pd, Cu, Cr, and AU.

Figure 21:
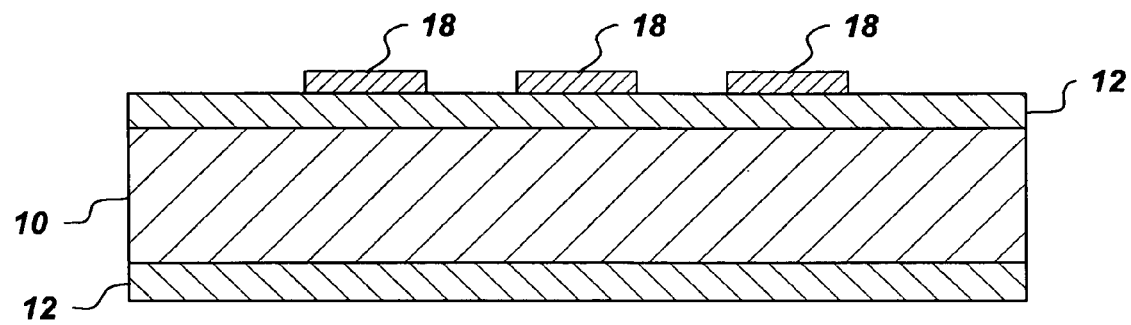
Figure 22:
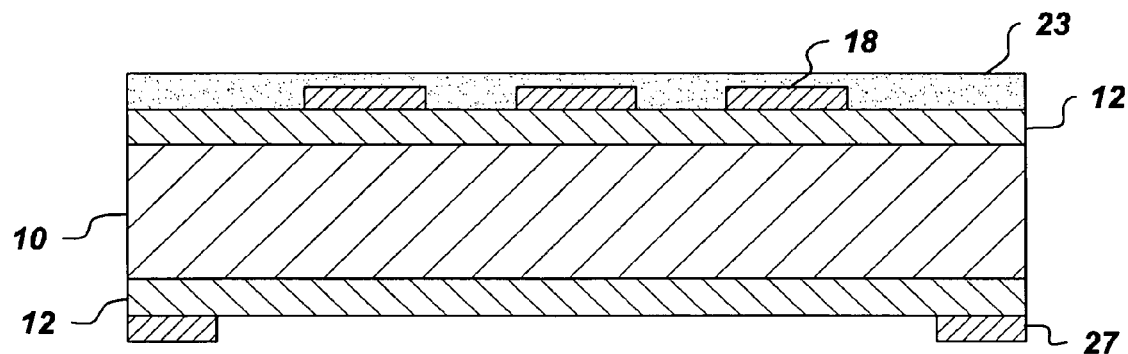
Figure 23:
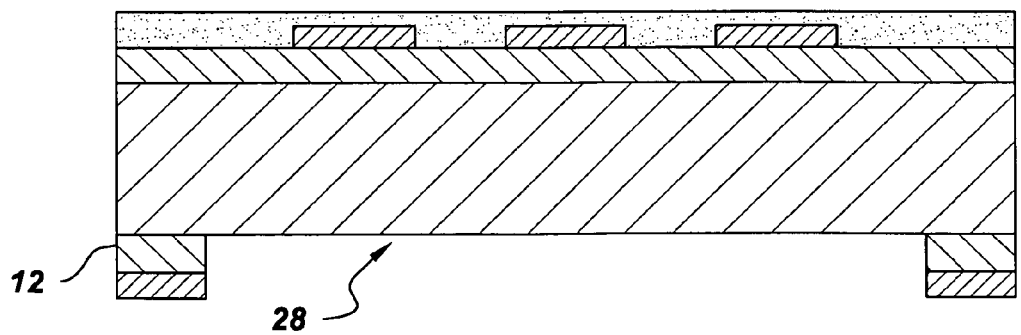

FIG. 21 illustrates newly formed conductors 18 resulting from the dissolution and removal of the photoresist 19 and the corresponding conductive layer 16 that was deposited on the photoresist. In FIG. 22, a non-photosensitive resist 23 is applied to protect the conductors 18 on the frontside of the device and a photoresist material 27 is applied to the backside of the device. The photoresist material 27 is then exposed and developed via photolithography to define the location in the substrate 10 where the cavity 28 will be created through e.g., an anisotropic etch process.

As was described above with respect to FIG. 2, capacitive magneto-MEMS component 30 may include a first mechanical sense component 45a and a second mechanical sense component 45b. In one embodiment, the first mechanical sense component 45a is associated with a first substrate, whereas the second mechanical sense component 45b is associated with a second substrate. The first and second substrates may together be referred to as the structural component 40, and separately as a first structural component 40a and a second structural component 40b. As has been previously described, the first mechanical sense component 45a and the second mechanical sense component 45b may be used to sense a mechanical indicator of a current as manifested by a change in capacitance between the respective sense components.

Figure 24:
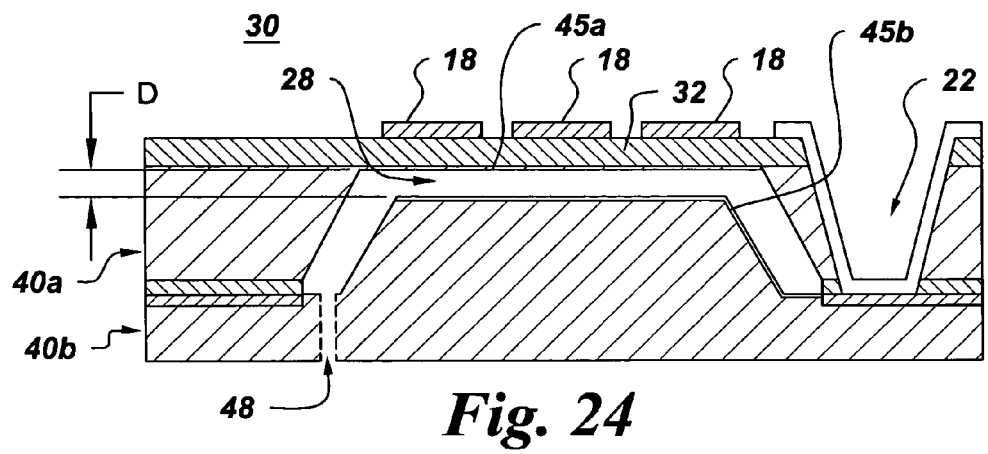
FIG. 24 illustrates a further embodiment of capacitive magneto-MEMS component 30.

FIG. 24 illustrates a further embodiment of capacitive magneto-MEMS component 30. In the illustrated embodiment, the first mechanical sense component 45a is aligned adjacent to the second mechanical sense component 45b such that the distance D defined therebetween measures less than 1 um for example. In one embodiment, the distance D defined between the two mechanical sense components measures approximately 100 nm. As such, small deflections (e.g., on the order of nanometers) of the membrane 32 may be detected by the mechanical sense components. In one embodiment, the cavity 28 into which the membrane 32 deflects may comprise a vacuum so as to increase the sensitivity of the mechanical sense components and thereby decrease the amount of deflection of the membrane 32 necessary in order to be detectable. However, if the vacuum is too high, the membrane 32 could be caused to artificially deflect into the cavity 28 independently of any possible mechanical indicators. In one embodiment, one or more vent holes 48 may be formed through the second structural component 40b to the cavity 28 to prevent squeeze film damping of the membrane 32.

Figure 25:
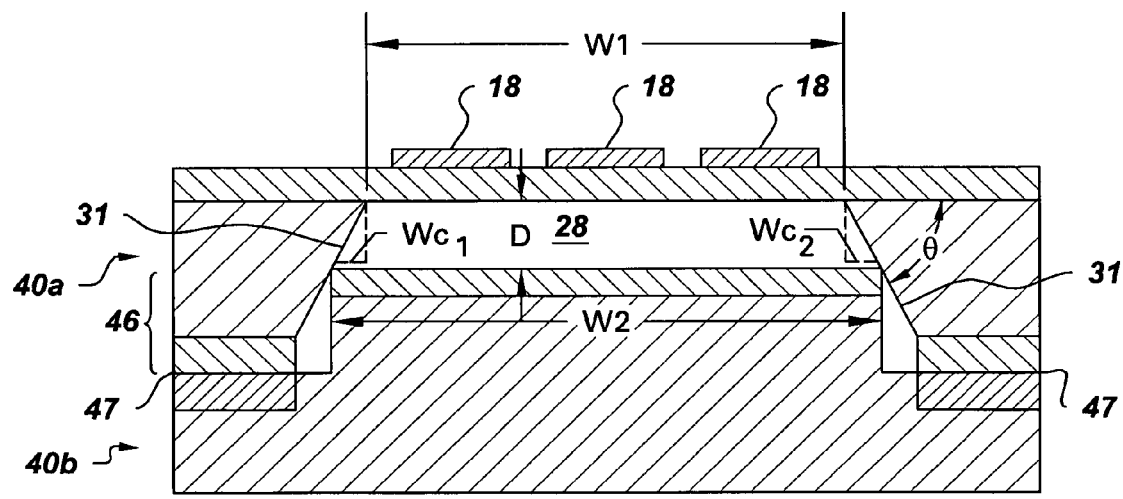
FIG. 25 illustrates one embodiment of a method for aligning such a first and second substrate.

Although it may often be desirable to have the two mechanical sense components separated by a very small (e.g., less than 1 um) distance, in practice it may be difficult to achieve such a small separation. In one embodiment, a first and second substrate (including respective first and second mechanical sense components 45a and 45b) may be aligned with each other such that a preferred separation distance 'D' is achieved. FIG. 25 illustrates one embodiment of a method for aligning such a first and second substrate. As shown, the bottom substrate (e.g., indicated as a first structural component 40b) includes a raised portion 46 having a width $W_2$. Such a raised portion may be obtained, for example, by performing a deep reactive ion etching process on the substrate. Additionally, the membrane 32 of the second structural component 40a has a width $W_1$ and is formed at least partially over the cavity 28 defined between the angled walls 31 of the top substrate. In one embodiment, the angled walls 31 are obtained through an anisotropic etch process. Since the angle θ (Theta) of angled walls 31 can be determined with respect to the plain containing the first and second substrates (e.g., due to the known etch rate of the anisotropic etch solution used), width components $W_{C1}$ and $W_{C2}$ can also be determined using standard geometric relationships. As such, the width $W_2$ of raised portion 46 necessary to achieve a preferred separation distance 'D' between two substrates may be determined by the following equation: $W_2 = W_1 + W_{C1} + W_{C2}$. In one embodiment, the distance D is at least an order of magnitude less than the width W.

Figure 26:
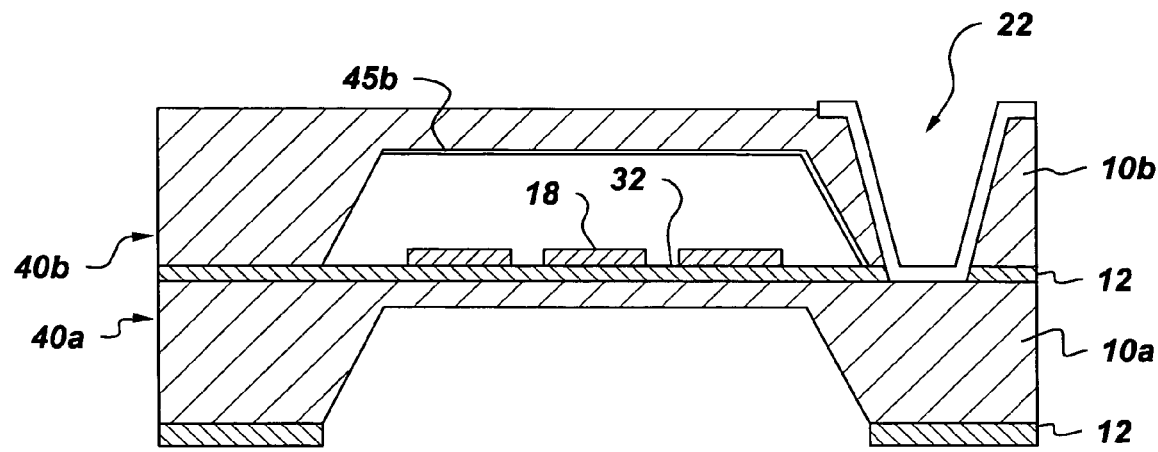
FIG. 26 illustrates an alternate embodiment of a capacitive readout mechanism for magneto-MEMS component 30.

In FIG. 25, the bottom structural component 40b is bonded to the backside of the top structural component 40a at location 47 to form a capacitive readout mechanism for the capacitive magneto-MEMS component 30. In other embodiments, the various structural components may be bonded together in other configurations to form different capacitive readout mechanisms. For example, FIG. 26 illustrates an alternate embodiment of a capacitive readout mechanism for magneto-MEMS component 30. In FIG. 26, the second structural component 40b and second mechanical sense component 45b are disposed at the topside of the first structural component 40a. Accordingly, as a Lorentz force for example, acts upon one or more conductor(s) 18, the membrane 32 will be deflected into the cavity 28. Such deflection can then be detected as a change in capacitance between the mechanical sense component 45b and either the conductor 18 acting as a mechanical sense component in the case of a single metal layer configuration (as shown) or another mechanical sense component 45a in a multiple metal layer configuration (not shown). In the illustrated embodiment, the via 22 may be provided to access the otherwise inaccessible mechanical sense component, whether it is the conductor 18 acting as a sense component or mechanical sense component 45a.

Figure 27:
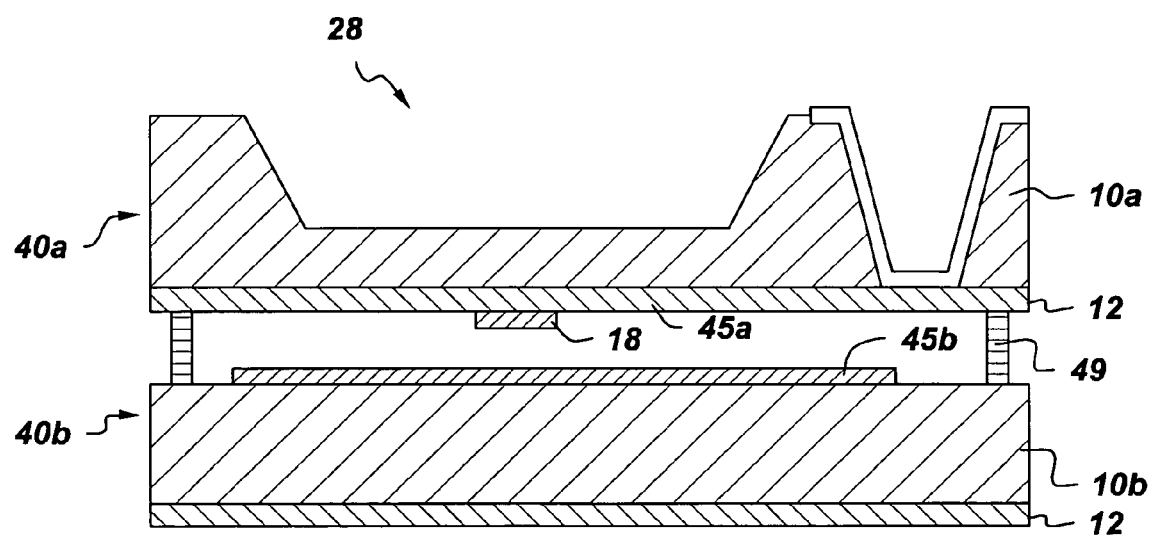
FIG. 27 illustrates yet another embodiment of a capacitive readout mechanism for magneto-MEMS component 30.

FIG. 27 illustrates yet another embodiment of a capacitive readout mechanism for magneto-MEMS component 30. Once again, the structural component 40a is similar in form to its analogue of FIG. 24. However in FIG. 27, the top structural component 40a has been inverted. That is, the cavity 28 has been etched or otherwise created through the topside of the top structural component 40a. Moreover, an electrode designed to operate as a mechanical sense component 45b is formed on the bottom structural component 40b. Additionally, one or more spacers 49 are formed on the bottom structural component 40b to separate the top structural component 40a from the bottom structural component 40b. In one embodiment, the spacers may be created from the same material as the substrate 10 of the bottom structural component 40b. In one embodiment, at least one of the mechanical sense component 45b and the spacers 49 are created through e.g., sputtering of Au on the substrate 10 of the bottom structural component 40b. Accordingly, as a Lorentz force for example, acts upon one or more conductor (s) 18, the membrane 32 will be deflected upward into the cavity 28. Such deflection can then be detected as a change in capacitance between the mechanical sense components 45a and 45b. In the illustrated embodiment, the via is provided to access the otherwise inaccessible mechanical sense component 45a. In one embodiment, a first wafer containing the first structural component 40a and associated materials is aligned with and bonded to a second wafer containing the second first structural component 40b and associated materials before the wafers are diced.

Conclusion

As disclosed herein, the need to physically contact a first current carrying conductor 4 to sense the current I is obviated. It is also noted that due to the small dimensions of micro-machined MEMS devices, the MEMS-based current sensor 100 is itself a dimensionally small device. Accordingly, the change in the magnetic field being sensed by the MEMS-based current sensor 100 at various points on the sensor is very small. The MEMS-based current sensor 100 is therefore accurate since there is no need to compensate for variances across the measuring sensor itself.

Due at least in part to the use of MEMS technology, the magnetic forces required to operate the MEMS devices are relatively small. The current sensor hereof thus tends to generate relatively little heat. This is advantageous in that there is little heat generated by the current sensors herein that may introduce an error in the sensing of the current I.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A micro-electromechanical system (MEMS) current & magnetic field sensor for sensing a magnetic field produced by a conductor comprising:
   a MEMS-based magnetic field sensing component having a capacitive magneto-MEMS component for sensing said magnetic field and, in response thereto, providing an indication of said current in said conductor;
   a first structural component having a cavity defined therein and a membrane material defined at least partly above the cavity;
   a second structural component coupled to the first structural component; and
   a conductor coupled to at least one of the first and second structural components for providing a mechanical indication of said magnetic field.

2. A micro-electromechanical system (MEMS) current & magnetic field sensor for sensing a magnetic field produced by a current carrying conductor, comprising:
   a first structural component;

a second structural component coupled to the first structural component;

a magnetic-to-mechanical converter coupled to at least one of the first and second structural components for providing a mechanical indication of said magnetic field; and a mechanical sense component for sensing the mechanical indication based at least in part upon a change in capacitance, and in response thereto, providing an indication of the current in said current carrying conductor.

3. The MEMS current & magnetic field sensor of claim 2, wherein said first and second structural components comprise elements selected from a group consisting of a cantilever, a deflectable membrane, a diaphragm, and a flexure member.

4. The MEMS current & magnetic field sensor of claim 2, wherein said mechanical sense component comprises a first mechanical sense component and a second mechanical sense component to sense said mechanical indication using a change in capacitance as measured between said first and second mechanical sense components.

5. The MEMS current & magnetic field sensor of claim 2, further comprising at least one of a compensator for enhancing a function of said MEMS-based magnetic field sensing component and an output component.

6. The MEMS current & magnetic field sensor of claim 5, wherein said output component comprises a mechanical-to-electrical converter for converting a mechanical change signal to an electrical signal representative thereof, and providing said electrical signal as an output signal indicative of said current in said current carrying conductor.

7. The MEMS current & magnetic field sensor of claim 6, wherein said output component further comprises a capacitive bridge.

8. The MEMS current & magnetic field sensor of claim 2, wherein the first structural component comprises a membrane and a first electrically conductive layer, the second structural component comprises a second electrically conductive layer, and the capacitance is measured between the first and second electrically conductive layers.

9. The MEMS current & magnetic field sensor of claim 8, wherein the first structural component further comprises a cavity disposed at least partly below the membrane such that said capacitance varies as the membrane deflects into the cavity.

10. The MEMS current & magnetic field sensor of claim 9, wherein the membrane comprises low stress silicon nitride.

11. The MEMS current & magnetic field sensor of claim 9, wherein the membrane comprises released silicon nitride.

12. The MEMS current & magnetic field sensor of claim 8, wherein the first structural component comprises a first metal layer, a second metal layer and an intervening insulating layer disposed between the first and second metal layers.

13. The MEMS current & magnetic field sensor of claim 8, wherein the second structural component comprises a silicon substrate and at least one coating of silicon nitride.

14. The MEMS current & magnetic field sensor of claim 13, wherein the second structural component comprises at least one vent hole to reduce damping of the membrane.

* * * * *